US009180539B1

(12) United States Patent
Cheung et al.

(10) Patent No.: US 9,180,539 B1
(45) Date of Patent: Nov. 10, 2015

(54) METHOD OF AND SYSTEM FOR DRESSING RF SHIELD PADS

(71) Applicant: Flextronics AP, LLC, Broomfield, CO (US)

(72) Inventors: Dason Cheung, Fremont, CA (US); Murad Kurwa, San Jose, CA (US)

(73) Assignee: Flextronics AP, LLC, Broomfield, CO (US)

(*) Notice: Subject to any disclaimer, the term of this patent is extended or adjusted under 35 U.S.C. 154(b) by 0 days.

(21) Appl. No.: 14/218,557

(22) Filed: Mar. 18, 2014

(51) Int. Cl.
*B23K 31/02* (2006.01)
*B23K 1/018* (2006.01)
*B23K 1/20* (2006.01)

(52) U.S. Cl.
CPC .. *B23K 1/018* (2013.01); *B23K 1/20* (2013.01)

(58) Field of Classification Search
None
See application file for complete search history.

(56) References Cited

U.S. PATENT DOCUMENTS 4,817,851 A * 4/1989 Kolesar et al. ................ 228/119
4,880,154 A * 11/1989 Tank .......................... 228/122.1
4,899,920 A * 2/1990 Abbagnaro et al. ............ 228/11
4,954,453 A * 9/1990 Venutolo ......................... 29/592
4,972,990 A * 11/1990 Abbagnaro et al. ......... 228/20.1
5,152,056 A * 10/1992 Shook ............................ 29/840
5,472,133 A * 12/1995 Lin .................................. 228/8
5,549,240 A * 8/1996 Urban ........................... 228/264
5,668,699 A * 9/1997 Bell et al. ...................... 361/753
5,758,816 A * 6/1998 Rabinovich ................... 228/121
6,083,848 A * 7/2000 Sugasawara et al. ......... 438/745
6,142,356 A * 11/2000 Yamazaki et al. ............. 228/6.2
6,163,014 A * 12/2000 Bergeron et al. ............. 219/388
6,168,065 B1 * 1/2001 Willemen ......................... 228/9
6,201,930 B1 * 3/2001 Close et al. ................... 392/379
6,299,053 B1 * 10/2001 Kamath et al. ................ 228/121
6,580,050 B1 * 6/2003 Miller et al. ............... 219/85.16
7,084,356 B2 * 8/2006 English et al. ................ 174/361
7,296,727 B2 * 11/2007 Onobori et al. .......... 228/180.22
7,703,197 B2 * 4/2010 Moltion .......................... 29/762
7,836,583 B2 * 11/2010 Amurao et al. ................. 29/762
2004/0240192 A1 * 12/2004 Seidler .......................... 361/816
2005/0279813 A1 * 12/2005 Song et al. ............... 228/180.22
2006/0054657 A1 * 3/2006 Francis ........................... 228/19
2006/0076388 A1 * 4/2006 Sato ............................. 228/102
2006/0131360 A1 * 6/2006 Durston et al. ............... 228/101
2006/0225270 A1 * 10/2006 Wong et al. ...................... 29/739
2008/0173699 A1 * 7/2008 Shoji et al. ................. 228/248.1
2009/0120924 A1 * 5/2009 Moffatt et al. ................ 219/385
2010/0238362 A1 * 9/2010 Hughes et al. ................ 348/738
2011/0240720 A1 * 10/2011 Okada et al. .................. 228/264
2012/0118940 A1 * 5/2012 Cheung et al. ................ 228/264
2012/0192406 A1 * 8/2012 Hafeli et al. ................ 29/592.1
(Continued)

*Primary Examiner* — Kiley Stoner
(74) *Attorney, Agent, or Firm* — Haverstock & Owens LLP

(57) ABSTRACT

A radio-frequency (RF) shield pad is "dressed" by automatically removing melted solder from the shield pad by traversing a pattern of the shield pad. After an RF shield has been removed from a shield pad of a printed circuit board (PCB), the PCB is pre-heated to a temperature sufficient to heat solder on the shield pad and to prevent thermally stressing the PCB during the dressing process. The solder is melted, such as by a heated tip of a desoldering tool, and the melted solder is vacuumed while the tip automatically traverses the pattern of the shield pad, until all or a threshold amount of the melted solder has been removed from the shield pad. After the PCB has been reworked, solder paste is automatically disposed on the RF-shield pad, the RF shield is temporarily mounted on the RF-shield pad, and the PCB is processed in a reflow oven, thereby securely attaching the RF shield to the PCB.

9 Claims, 13 Drawing Sheets

200 201 272 245C 265 260 245B 280 220 274 240 250 290 215A 215B 271 266 278 210 270C 273 276 277 275 211 270B 270A Z X Y

(56) References Cited

U.S. PATENT DOCUMENTS

| | | | | |
|---|---|---|---|---|
| 2013/0008938 | A1* | 1/2013 | Kim et al. | 228/203 |
| 2014/0034708 | A1* | 2/2014 | Cheung et al. | 228/103 |
| 2014/0166350 | A1* | 6/2014 | Rappoport | 174/258 |
| 2014/0262012 | A1* | 9/2014 | Martenson et al. | 156/277 |
| 2014/0339688 | A1* | 11/2014 | Gaddi et al. | 257/659 |

* cited by examiner

METHOD OF AND SYSTEM FOR DRESSING RF SHIELD PADS

FIELD OF THE INVENTION

This invention relates to semiconductor printed circuit boards. More particularly, this invention relates to reworking semiconductor printed circuit boards.

BACKGROUND OF THE INVENTION

A typical electronic device contains many components spaced closely together on a printed circuit board (PCB). In some designs, the PCB contains components sensitive to radio-frequency (RF) signals and enclosed within RF shields that protect them from RF signals. Generally, in these designs the RF shield is soldered to the PCB at an RF-shield contact pad on the PCB, thereby both securing the RF shield to the PCB and grounding it to the PCB ground.

When the RF-sensitive components must be reworked, by repairing and replacing them or by substituting new components, these RF shields are removed from the RF-shield pad. The shield pad is "dressed" to remove excess solder from it. As one example, an operator places the hot tip of a desoldering iron adjacent to the solder to melt the solder and then vacuums the melted solder from the RF-shield pad. After the components have been reworked, fresh solder paste is applied to the RF-shield pad, the RF shield is replaced at the RF-shield pad, and the entire PCB is subject to a reflow process to securely reattach the RF shield to the RF-shield pad.

There are several drawbacks to dressing RF-shield pads in this manner. The operator might not remove all or a sufficient amount of the solder, leaving residue solder on the RF-shield pad. The residue solder forms an uneven surface on the PCB, which can damage a nozzle dispensing solder paste for the reflow process. During the reflow process, the residue solder can flow and electrically couple adjacent components, shorting these components together. When the residue solder and fresh solder paste harden, the resulting seal between the RF shield and RF-shield pad might have gaps, exposing the RF-sensitive components to RF signals when the electronic device is being used. During the reflow process, the residue solder might decrease the strength or integrity of the seal. Finally, components on the PCB can be damaged if inadvertently touched by the hot tip of a soldering iron. All of these drawbacks make this method of dressing less reliable, more time-consuming, and, thus, more expensive.

BRIEF SUMMARY OF THE INVENTION

In accordance with the principles of the invention, an automated tool dresses PCB contact pads to ensure that residue solder is efficiently removed, while reducing the likelihood that the PCB components are damaged by heated dressing equipment. The dressing process is automatically configurable to dress contact pads with any number of patterns and configurations, thereby increasing the throughput and efficiency of the rework processes.

In a first aspect of the invention, a method of dressing a contact pad on a PCB, where the pad has solder disposed along its length, thereby defining a "solder path," includes pre-heating a surface of the PCB to a surface temperature ($T_S$) sufficient to heat the solder path and also to prevent thermal stress of the PCB during the dressing process, melting the solder on the solder path, and automatically traversing the solder path while removing the melted solder. The melted solder is removed in any manner, such as by vacuuming the melted solder, wicking the melted solder, or electromagnetically attracting the melted solder, to name only a few examples. Preferably, the solder path extends along an entire length of the pad, though in some embodiments the solder path extends along only a portion of the pad's length.

In one embodiment, the solder is melted and vacuumed using a desoldering tool, whose nozzle is maintained at a temperature ($T_N$) sufficient to melt the solder. The temperature $T_N$ varies, depending on the type of solder. As some examples, $T_N$ is approximately 183° C. for lead/tin solder and approximately 220° C. for lead-free solder. In one embodiment, the temperature $T_N$ is automatically maintained in the range 200° C. to 250° C. while the melted solder is removed. In one embodiment, $T_S$ is maintained in the range 120° C. to 140° C. while the melted solder is removed.

In one embodiment, the PCB is heated by heating a chamber in thermal contact with the PCB. In yet another embodiment, after the pad has been dressed, a solder paste is automatically applied to the pad, a component, such as an RF shield, is temporarily attached to the pad, and the PCB is subject to a reflow process to fixedly attach the component to the PCB at the pad.

In a second aspect of the invention, an automated system or robot dresses a pad on a PCB, where the pad has solder formed along its length, thereby defining a solder path. The system includes a heat-conducting platen configured to secure the PCB at a fixed location, a heating component configured for heating a surface of the heat-conducting platen, and thus the pad, a moveable desoldering tool having a tip configured to melt the solder and to vacuum melted solder, one or more motors coupled to the moveable desoldering tool, and a controller configured (e.g., programmed) for automatically controlling (a) the heating component to heat the surface of the heat-conducting platen to a first temperature sufficient to heat the solder path and to reduce thermal stress of the PCB during the dressing process, yet insufficient to damage components on the PCB during the dressing process, (b) the one or more motors to move the desoldering tool along the solder path, and (c) the heated desoldering tool to melt the solder and vacuum the melted solder along the solder path. Preferably, the platen includes a cutout contoured to a periphery of the PCB, thereby securing the PCB to the platen.

The heating component includes a chamber disposed adjacent to a surface of the heat-conducting platen and a heating element operatively coupled to the controller and disposed within the chamber. The controller automatically maintains a temperature on a surface of the platen within a first pre-determined range and automatically maintains a temperature at a tip of the desoldering tool within a second pre-determined range during the dressing process.

The system also includes first, second, and third temperature sensors operatively coupled to the controller. The first temperature sensor is disposed within the chamber, the second temperature sensor is disposed on the surface of the platen, and the third temperature sensor is disposed adjacent to the tip of the desoldering tool.

In yet another embodiment, in addition to vacuuming melted solder, the desoldering tool is also configured to dispense solder paste on the pad, and the controller is also configured to control the desoldering tool to traverse the solder path while dispensing solder paste along the solder path.

In one embodiment, the controller includes a processor and computer-readable media containing computer-executable instructions that when executed by a processor automatically heats the chamber to thereby heat the surface of the platen to a first temperature within the first pre-determined range, moves the desoldering tool along the solder path (e.g., a portion of the length of the pad or the entire length of the pad), and causes the desoldering tool to melt the solder along the solder path and vacuum melted solder along the solder path. In another embodiment, the steps also include dispensing solder paste along the solder path, such as before a reflow process.

In another embodiment, the system also includes a reader for reading from the PCB a label (code) identifying a solder path on the PCB, the computer-readable media stores a table mapping labels to corresponding solder paths, and the controller uses the table to map the code on the PCB to the corresponding solder path. As just some examples, the labels include striped bar codes, matrix bar codes, or alphanumeric strings.

In a third aspect of the invention, a method of preparing a PCB for reworking, where the PCB contains a contact pad with solder disposed thereon, thereby defining a solder pattern, includes automatically determining the solder pattern from a label on the PCB, melting solder along the solder pattern thereby producing melted solder, and removing the melted solder while traversing the solder pattern.

BRIEF DESCRIPTION OF THE SEVERAL VIEWS OF THE DRAWINGS

The figures are used merely to illustrate the principles of the invention and are not meant to limit the scope of the invention. In the figures, the same label refers to the identical or a similar element.

DETAILED DESCRIPTION OF THE INVENTION

Figure 1:
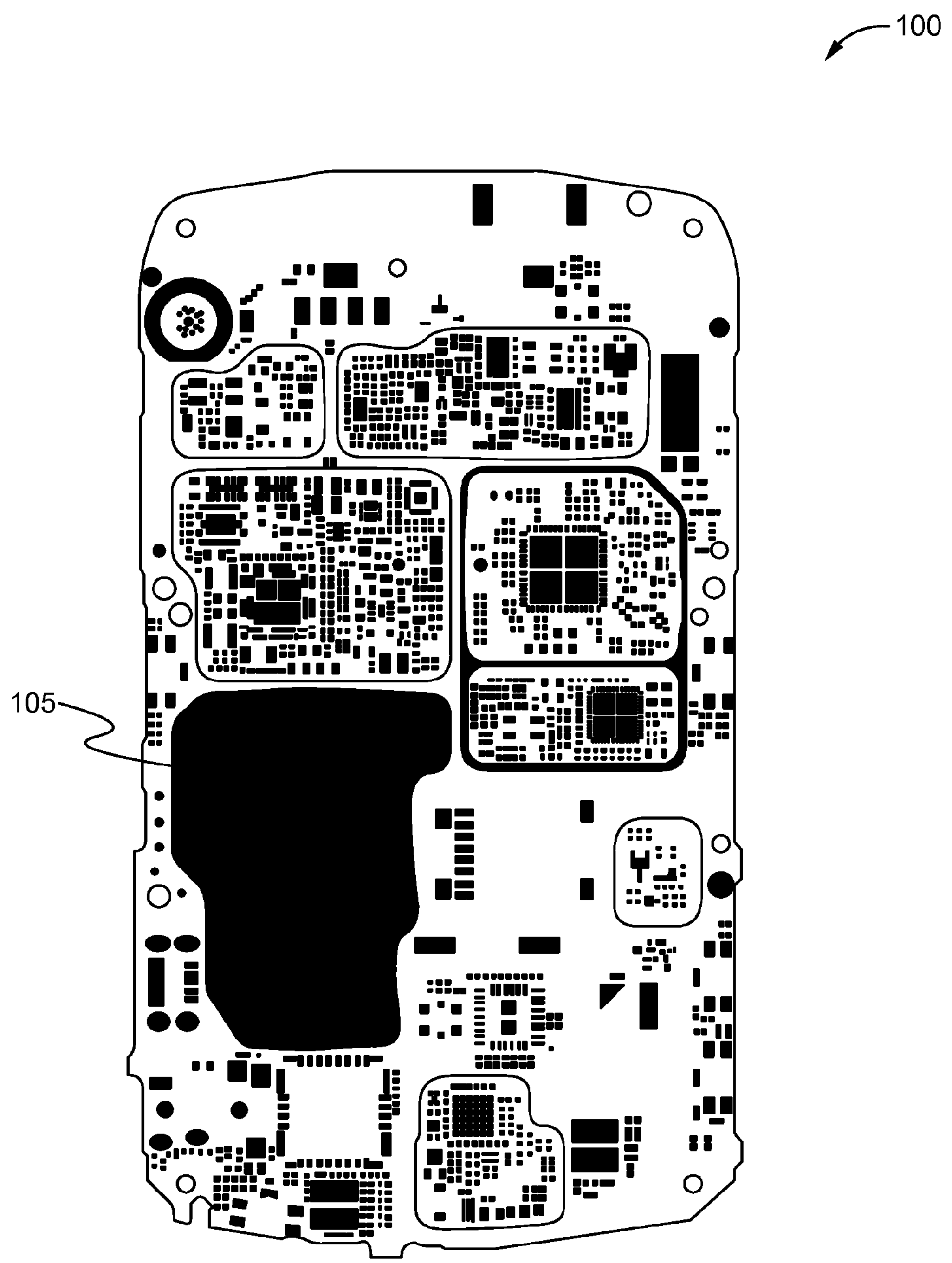
FIG. 1 shows a printed circuit board (PCB) containing a radio frequency (RF) shield before reworking components under the RF shield.

FIG. 1 shows a printed circuit board (PCB) 100 of an electronic device, such as a mobile phone, a laptop, a personal computer, or a tablet, to name only a few such devices. The PCB 100 has a radio-frequency (RF) shield 105 enclosing RF-sensitive components (not shown) on the PCB 100. The RF shield 105 is a conductive solid cage open along a bottom surface, to which it is soldered to the PCB 100 along an RF-shield contact pad. The contours of the bottom surface and the pad match. Preferably, the pad is electrically coupled to the electronic device's ground. Thus, when the RF shield 105 is properly soldered to the pad, seated so that there are no gaps between the bottom surface and the pad, the RF shield 105 is grounded and the RF-sensitive components are protected from RF signals during operation of the electronic device.

During PCB rework, the RF shield 105 is removed and one or more of the RF-sensitive components are repaired and reinserted, replaced with new components, or both. After the RF-sensitive components are reworked, a solder paste is applied to the RF-shield pad. The PCB 100, and thus the pad, is heated, the RF shield 105 or an equivalent RF shield is replaced at the pad, the solder paste melts, the heat is removed, and the solder hardens, thereby mechanically and electrically coupling the RF shield 105 to the PCB 100. Alternatively, the RF shield 105 is temporarily attached to the RF-shield pad with a solder paste and later fixedly attached during a solder reflow process.

Figure 2:
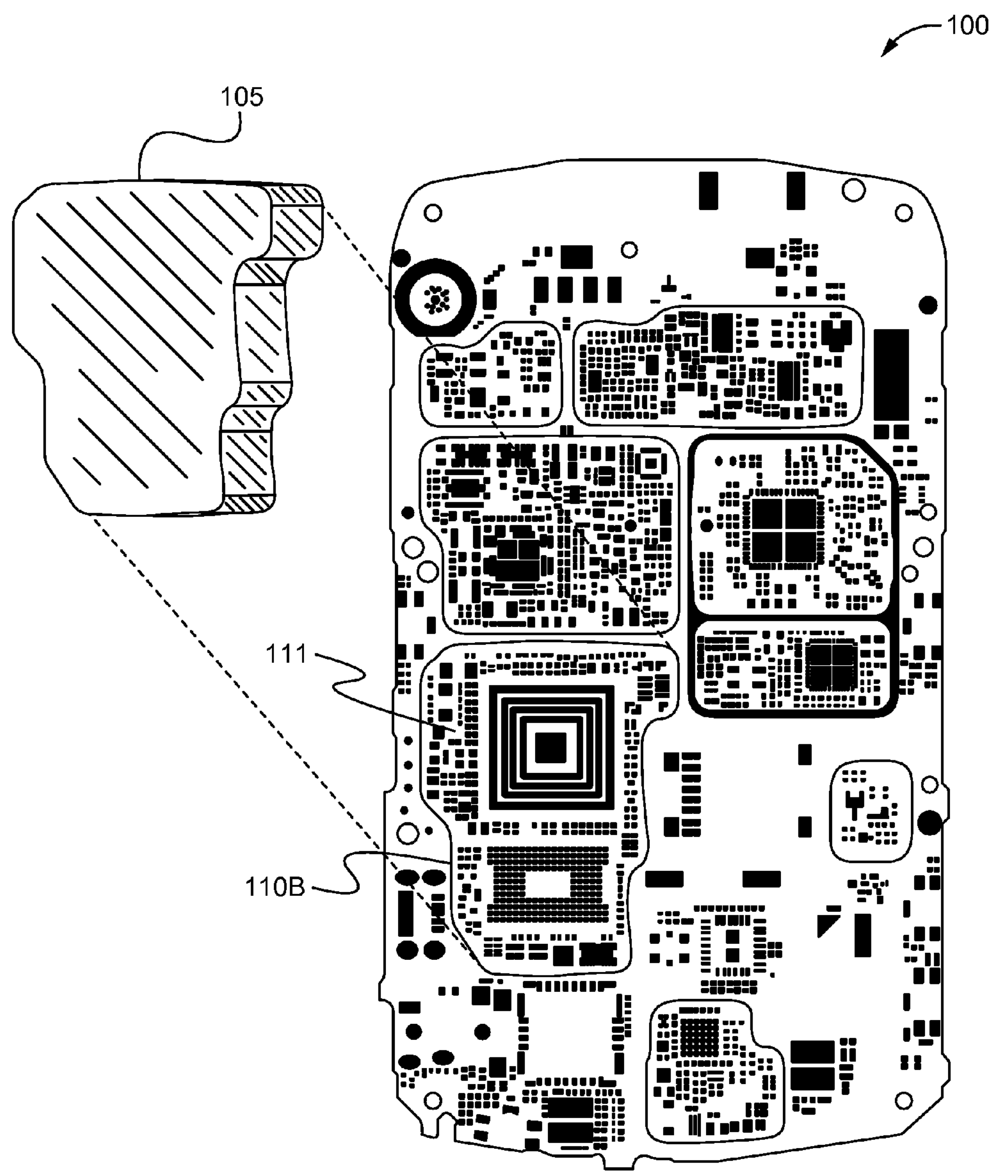
FIG. 2 shows the PCB of FIG. 1 after the RF shield has been removed from an RF-shield pad on the PCB.

FIG. 2 shows the PCB 100 after the RF shield 105 has been removed, exposing the RF-sensitive components 111 and the RF-shield pad 110A (not shown) overlaid by solder. The solder defines a solder path 110B. Before the RF shield 105 is replaced, the RF-shield pad 110A must be "dressed" to remove residue solder along the solder path. Among other things, this ensures that, during later solder reflow processing, nozzle and other processing equipment are not damaged by the presence of excess solder. This also ensures that, when replaced, the RF-shield 105 forms a tight, electrically conductive seal with the RF-shield pad 110A and thus the PCB 100.

Figure 3:
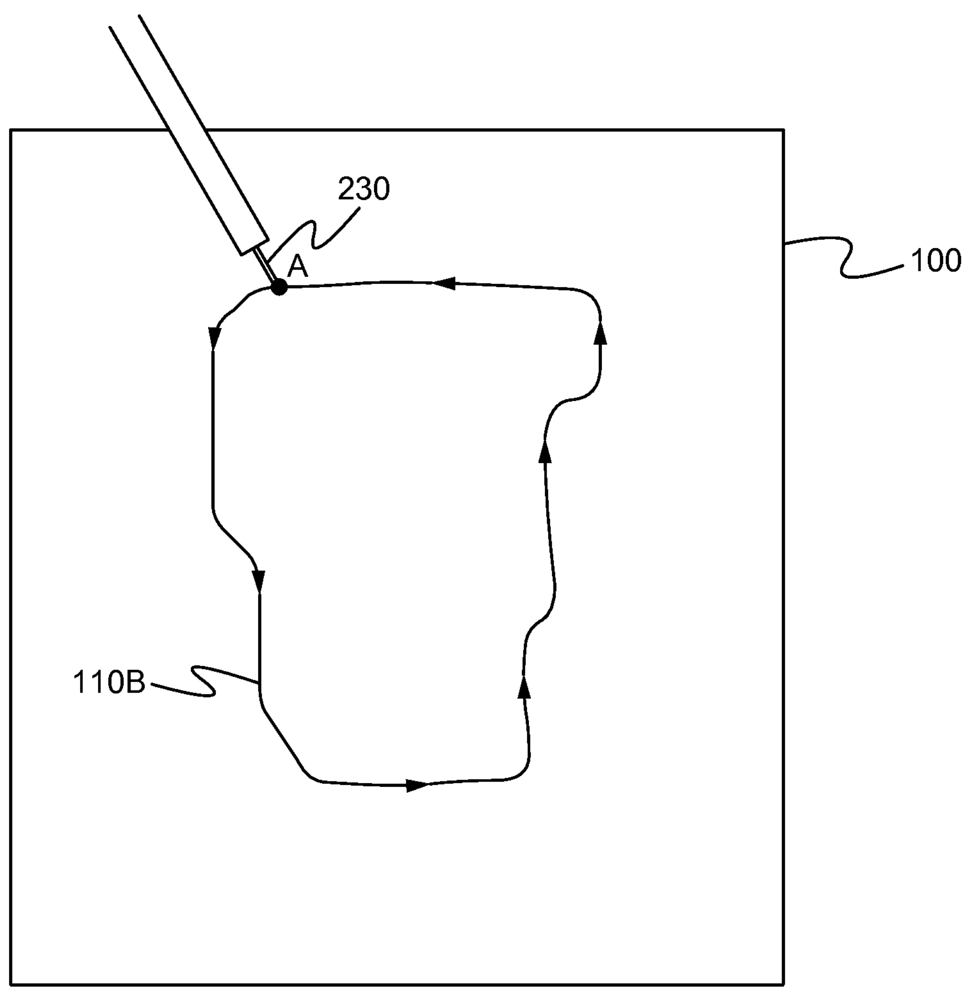
FIG. 3 shows a directional path (solder path) that an automated tool traverses to dress the RF-shield pad of FIG. 2, in accordance with one embodiment of the invention.

A system in accordance with the principles of the invention removes all or substantially all of the residue solder on the RF shield pad 110A while traversing the solder path 110B, such as by vacuuming, wicking, or electromagnetic attraction. As one example, FIG. 3 shows a solder path 110B, overlaying the RF-shield pad 110A, having a starting point "A," which a vacuum nozzle 230 of a desoldering tool traverses to remove residue solder.

Those skilled in the art will recognize that for RF-shields, the solder path will traverse the entire length of the RF-shield pad 110A. In these embodiments, the solder path forms a closed-loop, for completely sealing the RF-sensitive components under the RF-shield. In other embodiments, the solder path traverses only a portion of a pad's length, such as in discontinuous segments, such as where a component does not have to be soldered to the contact pad continuously, along the entire length of the contact pad.

Figure 4:
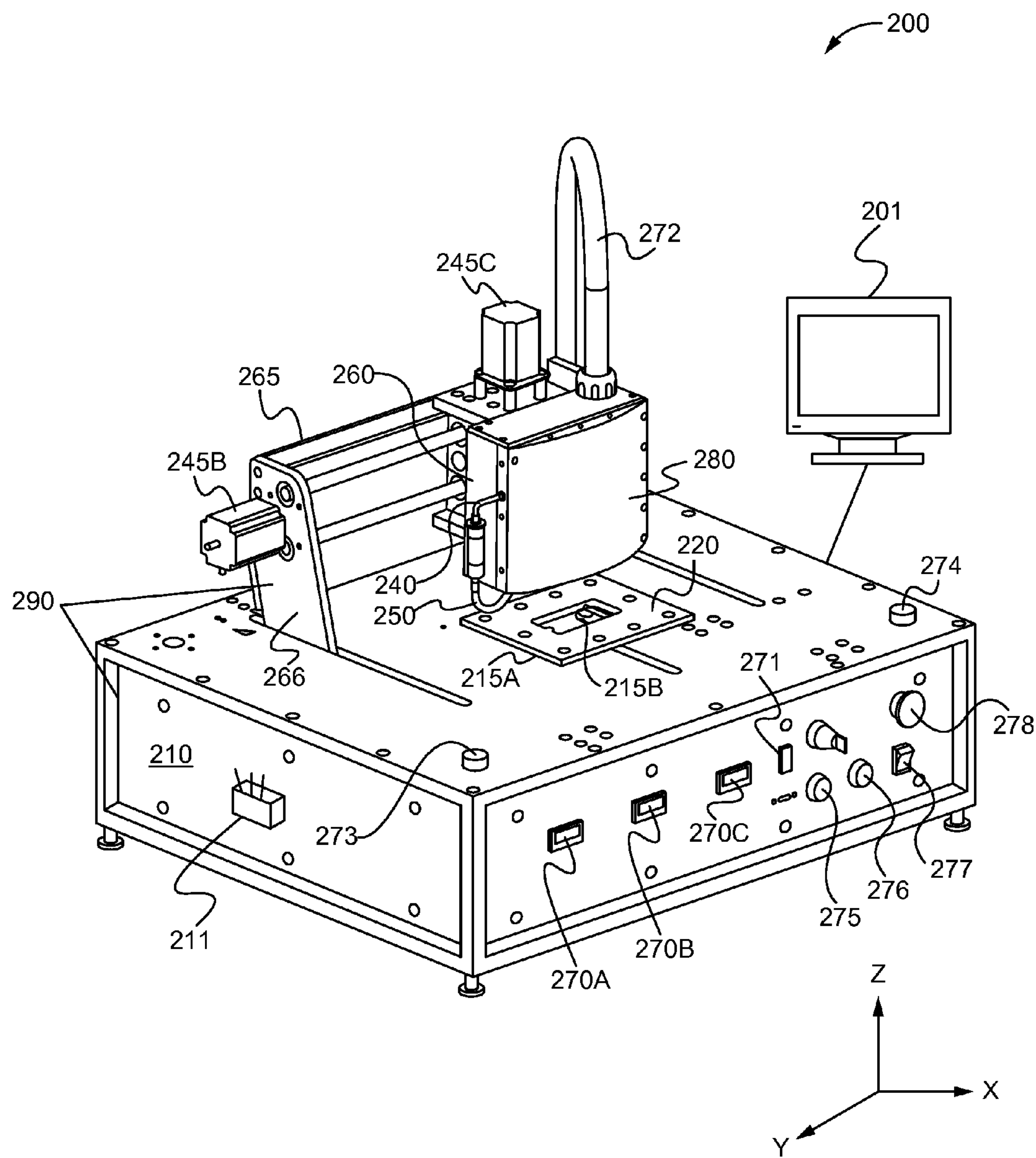
FIG. 4 shows an automated system for dressing a pad on a PCB, in accordance with one embodiment of the invention.

FIG. 4 shows an automated system (robot) 200 for dressing a contact pad, in accordance with one embodiment of the invention. The following example describes the system 200 dressing the PCB 100, though other PCBs are able to be dressed in accordance with the invention. The system 200 includes a work table 290, coupled to a display monitor 201, supporting a desoldering tool 280. The work table 290 includes a heat-conducting platen 220 for securing the PCB 100 to the system 200, an XYZ translation stage 265 for lowering the desoldering tool 280 adjacent to the solder path 110B on the PCB 100 and moving the desoldering tool 280 to trace the solder path 110B, and a heating chamber 210 for heating the platen 220. The heating chamber 210 is in thermal contact with the platen 220 and contains a heating element 211. The desoldering tool 280 includes a hollow nozzle tip 230 (element 230, FIG. 9) for melting solder and vacuuming the melted solder. A vacuum hose 250 couples the nozzle tip 230 to a vacuum 240 for removing the melted solder. During processing, the nozzle tip 230 is heated to a nozzle temperature $T_N$ sufficient to melt solder adjacent to the tip 230.

Because the platen 220 is heat-conducting, the temperature $T_C$ in the chamber 210 generates a temperature $T_S$ proportional to $T_C$ at a surface of the platen 220. Thus, the temperature $T_S$ is controlled by varying the temperature $T_C$. When the temperature $T_C$ reaches a lower threshold $T_{CL}$, the temperature $T_S$ is sufficient to pre-heat the PCB 100 to a "working temperature," that is, a temperature that heats up the solder path 100B and ensures that the PCB 100 does not suffer thermal stress during the dressing process. The platen 220 is formed of any heat-conducting material such as steel, copper, aluminum, or any other suitable material.

The XYZ translation stage 265 includes a gantry 266 moveable in the x- and y-directions, a tool holder 260 coupled to the gantry 266, and a plate 261 coupling the desoldering tool 280 to the tool holder 260 and moveable along the tool holder 260 in the z-direction. The xyz directions are all relative to the coordinate axes of FIG. 4. It will be appreciated that references to the x-, y-, and z-directions are arbitrary, used merely to describe one embodiment of the invention.

The desoldering tool 280 is operatively coupled to a controller (element 205, FIG. 6) over a wiring conduct 272 that includes wiring to transmit monitoring and control signals between the controller 205 and the desoldering tool 280. The worktable 290 includes a first motor 245A that moves the gantry 266, and thus the desoldering tool 280, in the x-direction, a second motor 245B that moves the tool holder 260 in the y-direction, and a third motor 245C that moves the plate 261 in the z-direction. The controller 205 (FIG. 6) is operatively coupled to the motors 245A-C, the vacuum 240, a heater on the desoldering tool 280 (element 246, FIG. 9), and the display monitor 201.

A first temperature sensor (e.g., a thermocouple) 215A is disposed within the chamber 210, and a second temperature sensor 215B is disposed on a surface of the platen 220 and is coupled to a thermocouple terminal 271. A third temperature sensor 215C (FIGS. 7 and 9) is disposed adjacent to the tip 230. The controller 205 is operatively coupled to the sensors 215A-C, which are used to monitor, respectively, the temperatures $T_C$, $T_S$, and $T_N$. The controller 205 ensures that the temperatures $T_S$ and $T_N$ are within predetermined ranges, thereby ensuring that the solder along the solder path 110B is melted, that the PCB 100 is not damaged by thermal stress during the dressing process, that the PCB 100 is not exposed to temperatures that would damage the PCB 100 or components on it, and that the solder tip 230 is hot enough that the vacuumed solder remains melted sufficiently long that it does not clog the vacuum hose 250, yet cool enough that it does not damage the desoldering tool 280, hose 250, or other downstream components. The work table 290 includes temperature indicators 270A, 270B, and 270C, indicating the temperatures $T_C$, $T_S$, and $T_N$, respectively.

The work table 290 includes START push buttons 273 and 274, a PC BOOT Button 275 (to trigger an initialization step, such as the step 301 in FIG. 12), a PC RESET button 276, a MAIN power switch 277, and an EMERGENCY (OFF) button 278.

It will be appreciated that the size of the tip 230 is tailored based on a width of the pad 110A and on the spacing between the pad 110A and adjacent components, e.g., the spacing between the pad 110A and the adjacent RF-sensitive components 111 surrounded by the pad 110A and the spacing between the pad 110A and the adjacent non-RF-sensitive components outside the pad 110A. More densely packed PCBs require a smaller solder tip 230 to fit within the smaller spaces. For example, on some PCBs, the component spacing is 0.2 mm and the width of the pad 110A is 0.73 mm. Those skilled in the art will recognize other diameters for the tip 230 based on the width of the pad 110A and the spacing between components on the PCB 100.

Figures 5, 6:
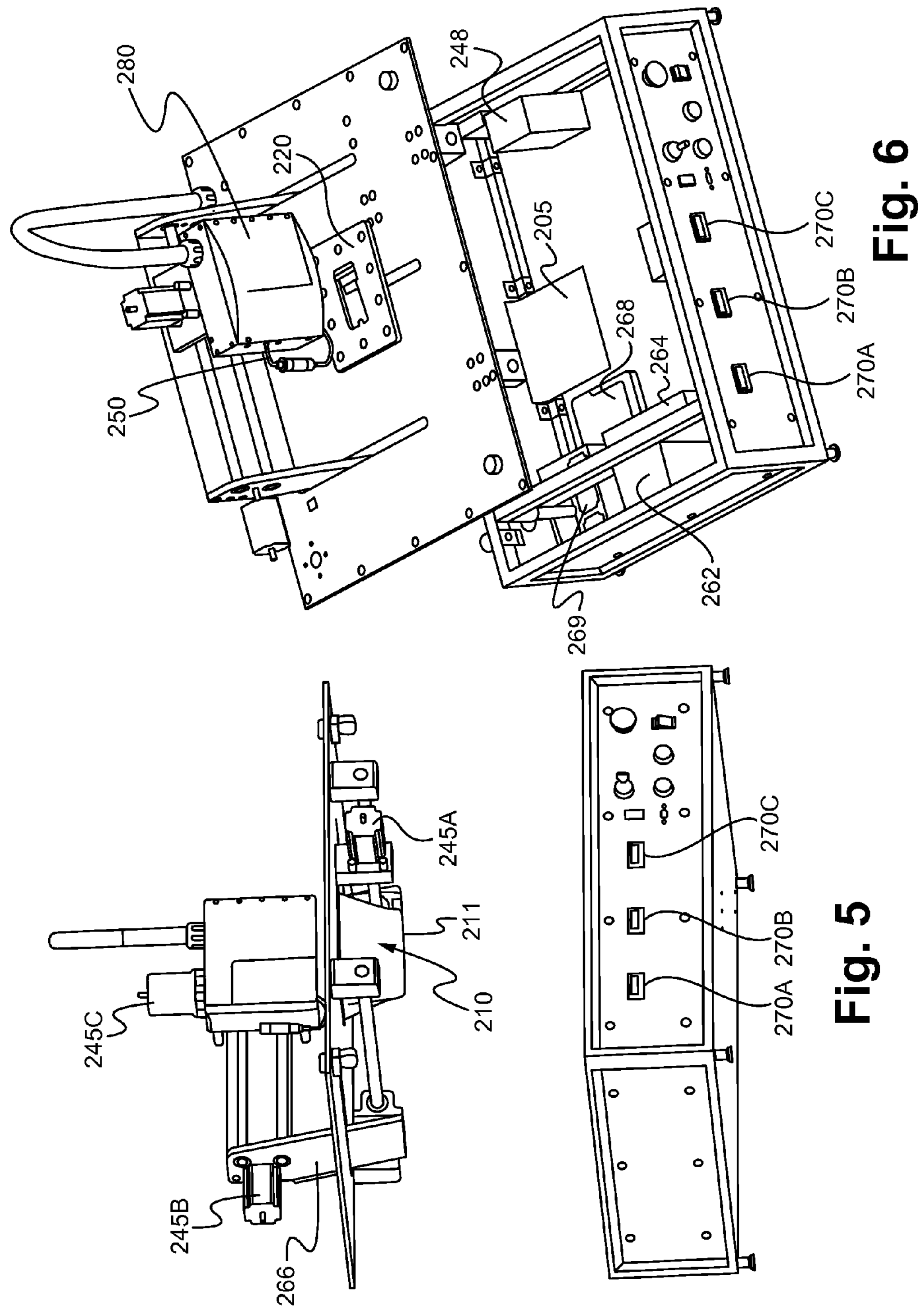
FIGS. 5 and 6 are exploded views of the work table of the system of FIG. 4.
Figure 7:
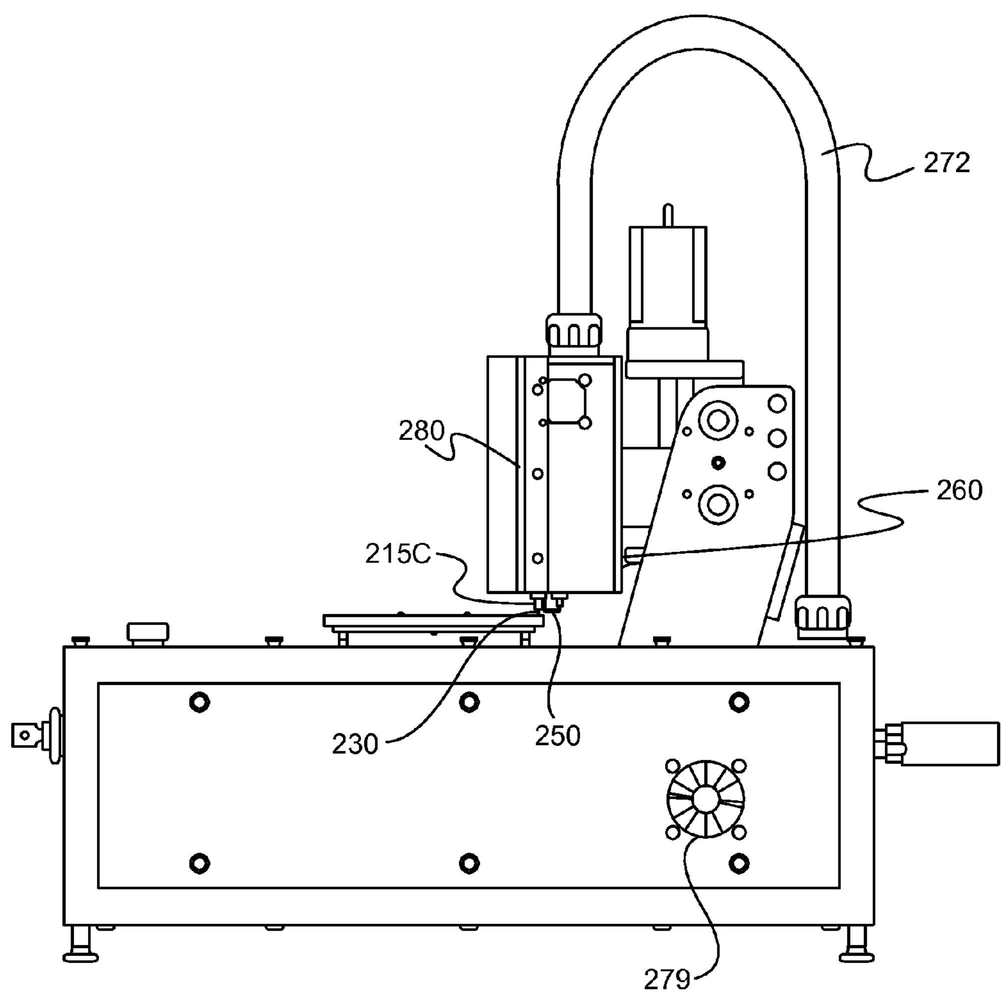
FIG. 7 is a side view of the work table of the system of FIG. 4.

FIGS. 5 and 6 are exploded views of the work table 290 holding the desoldering tool 280. FIG. 7 is a side view of the work table 290 showing, among other things, an exhaust fan 279. As shown in FIG. 6, the work table 290 includes the controller 205, a PC MB driver 248, a programmable logic controller (PLC) 262, a power supply 264, hard disk media 268, and a motion driver 269, for controlling movement of the motors 245A-C.

Figure 8:
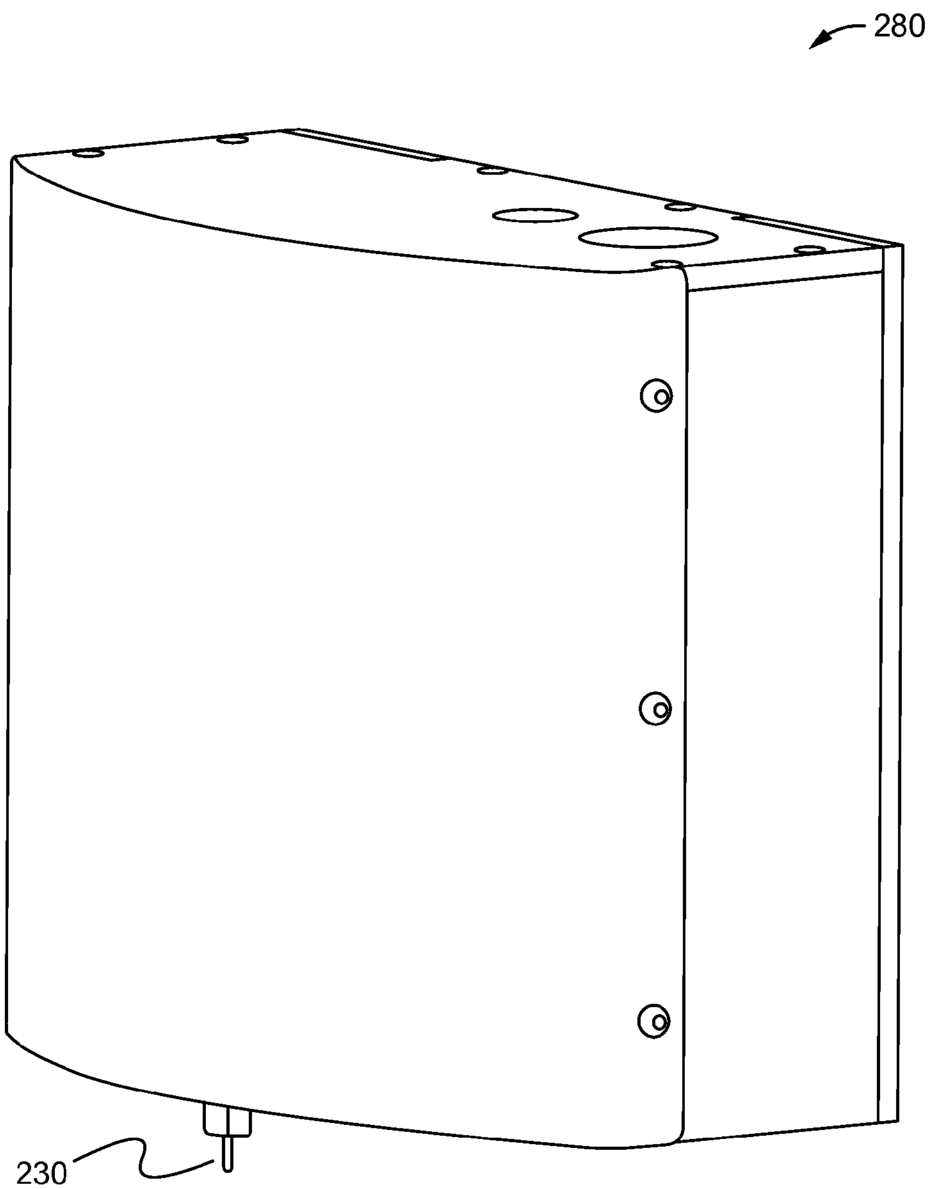
FIG. 8 shows the enclosed desoldering tool of the system of FIG. 4.
Figure 9:
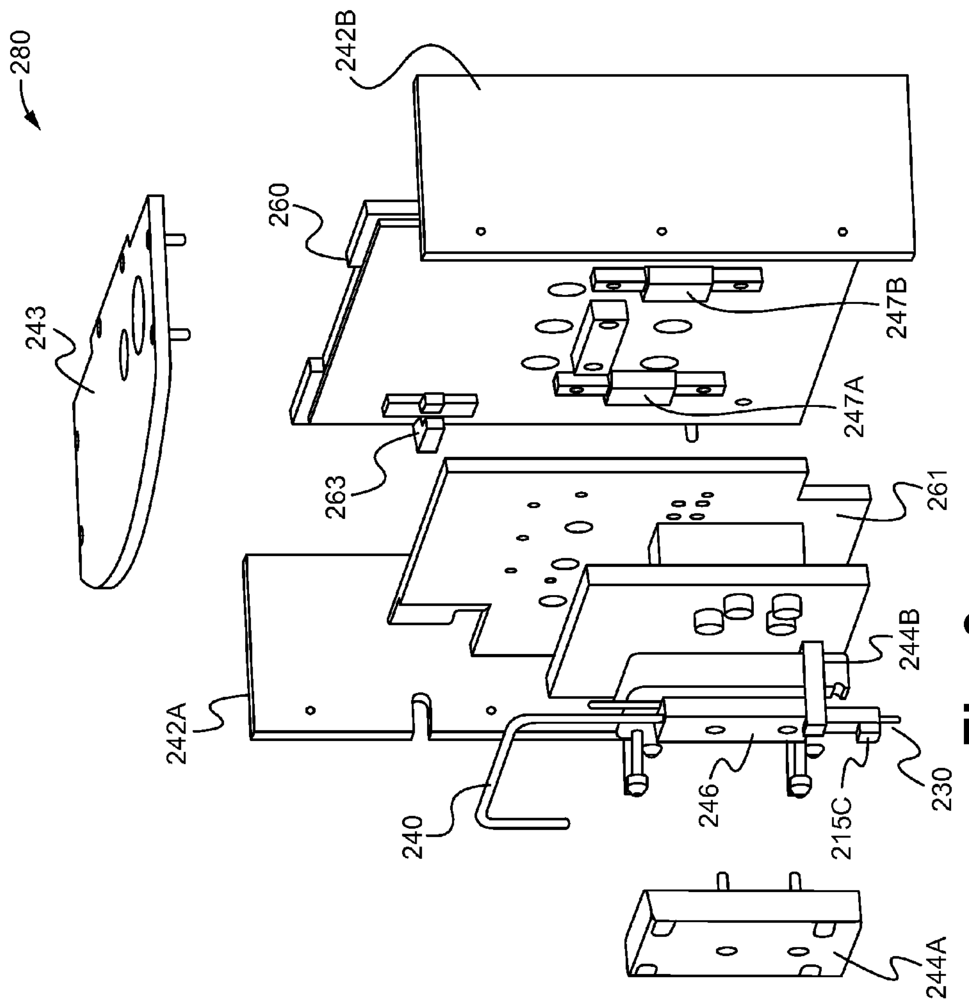
FIG. 9 is an exploded view of the desoldering tool shown in FIG. 8.
Figure 9:
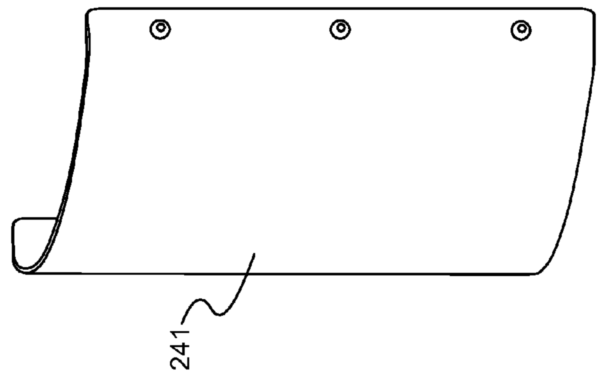

FIGS. 8 and 9 show, respectively, non-exploded and exploded views of the desoldering tool 280. As shown in FIG. 9, the desoldering tool 280 includes a heating element 246 in thermal contact with the nozzle tip 230 and fixedly attached to mated ceramic insulators 244A-B, a front cover 241, two side walls 242A-B, and a top plate 243. The plate 261 is fixedly coupled to the ceramic insulators 244A-B and slidably mounted on the holder 260 (some elements of which are removed for clarity but are described below). The holder 260 includes precision slides 247A-B and a detector 263 configured to sense the vertical position (e.g., in the z-direction) of the plate 261 on the holder 260.

Figure 10:
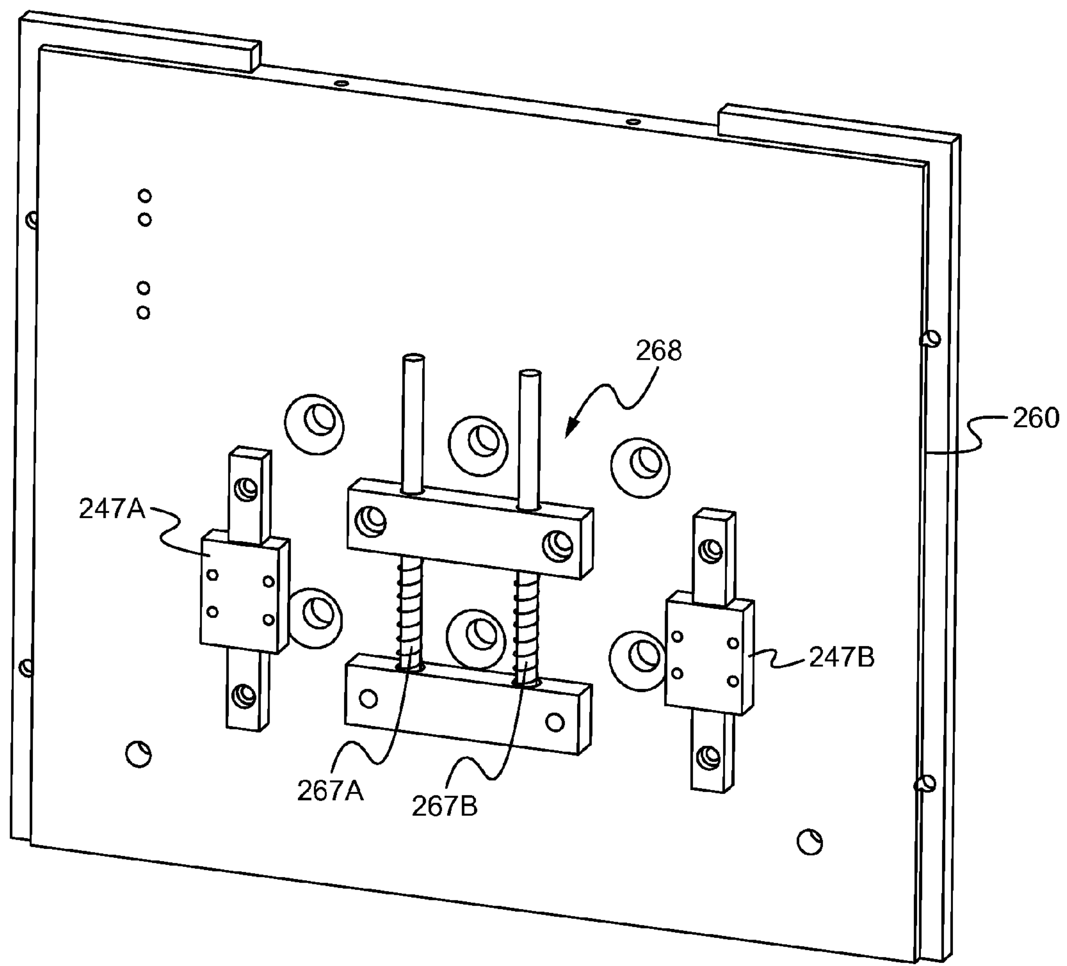
FIG. 10 is a more detailed view of the holder for supporting the desoldering tool, shown in FIG. 9.

FIG. 10 shows a portion of the holder 260 in more detail. The holder 260 includes a dampener 268 having springs 267A-B. The plate 261 is coupled to both the precision slides 247A-B, which allow for precise movement of the plate 261 in the z-direction. The plate 261 is also coupled to the dampener 267, whose springs 267A-B reduce the fixture weight during movement of the plate 261 in the z-direction.

During operation of the system 200, the motor 245C (under control of the controller 205) slides the plate 261 down and up (in the z-direction) to lower the tip 230 adjacent to the solder path 110B and to raise the tip 230 away from the solder path 110B. When the detector 263 senses that the plate 261 has traveled to predetermined positions (e.g., adjacent to the solder path 110B and to a fixed position removed from the solder path 110B), the controller 205 causes the motor 245C to stop moving the plate 261.

Figure 11:
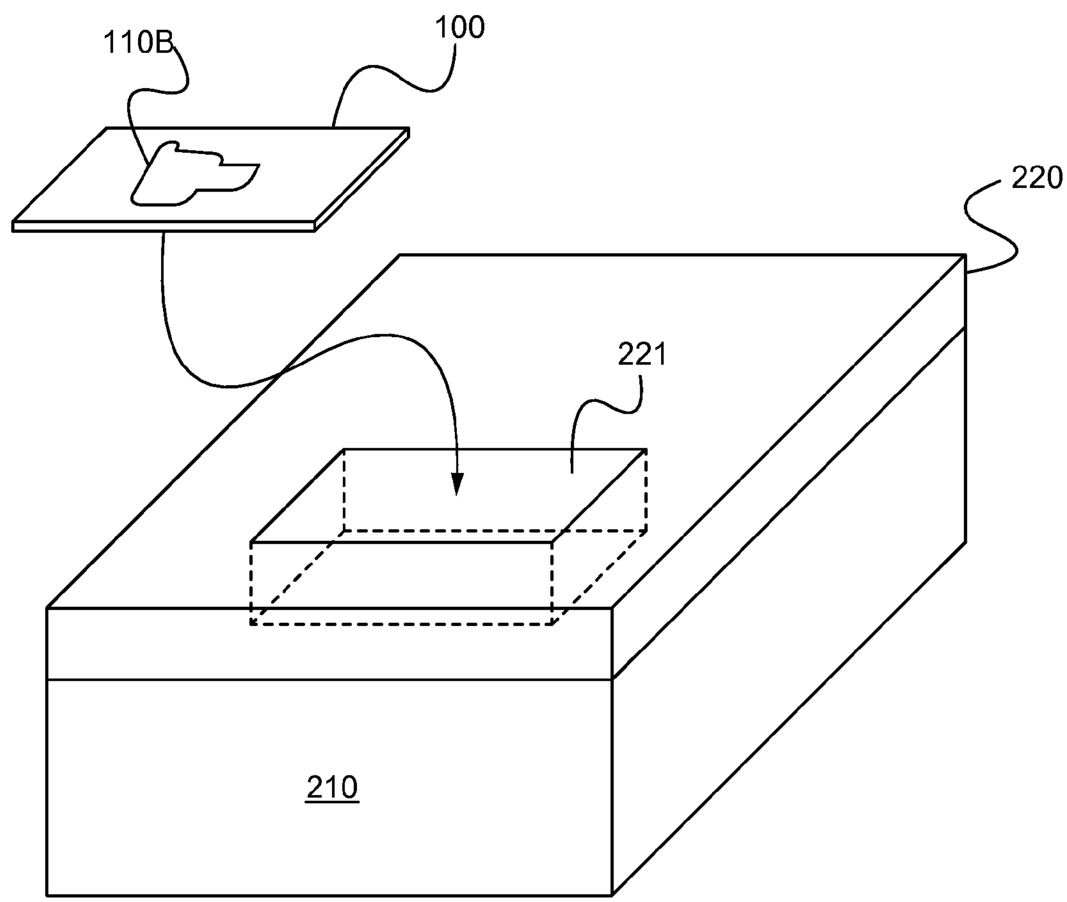
FIG. 11 shows a platen on the system of FIG. 4, including a surface having a cutout for orienting and securing a PCB.

FIG. 11 shows a side cross-sectional view of a portion of the platen 220 adjacent to the chamber 210. The platen 220 has a cutout 221 matching a contour of the periphery of the PCB 100 to receive the PCB 100. Thus, when the PCB 100 is inserted into the cutout 221, the PCB 100 is at least partially secured to the platen 220 and correctly oriented within the system 200. When the PCB 100 is inserted into the cutout 221, the controller 205 knows the exact location of the start point (e.g., point A in FIG. 3) for starting the dressing process. Preferably, the PCB 100 is further secured to the platen 220 using bolts or other fastening means (not shown).

Figure 12:
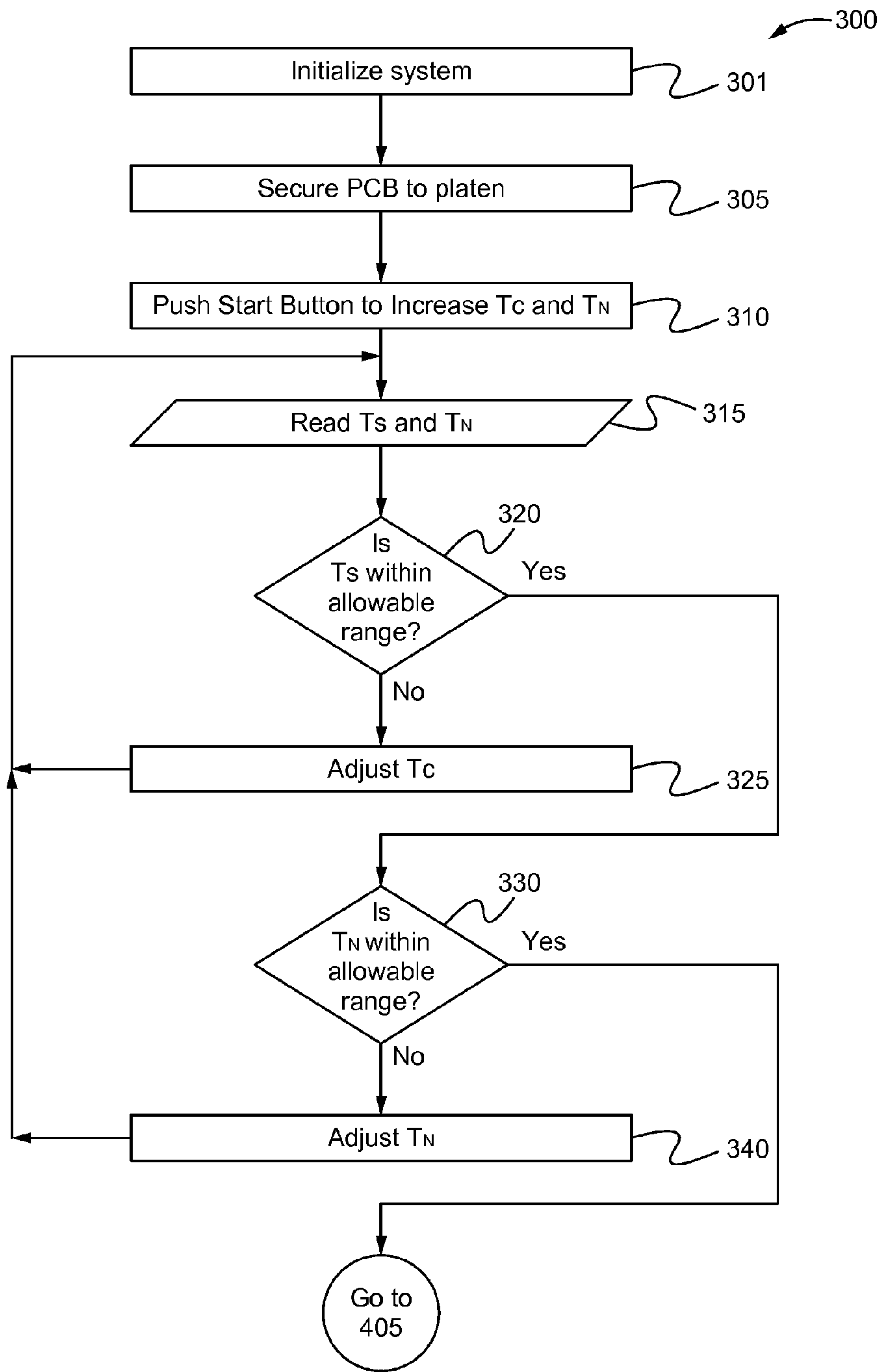
FIG. 12 shows the steps of a process for heating elements of the system of FIG. 4 within pre-determined ranges, in accordance with one embodiment of the invention.

FIG. 12 shows the steps 300 of a process executed by a controller (e.g., 205, FIG. 6) for initializing a system (e.g., 200, FIG. 4) for dressing a pad, in accordance with one embodiment of the invention. The steps 300 are performed after a component, such as an RF shield, has been removed from a PCB. The PCB 100 and the system 200 are used to illustrate the dressing process. The following terms are used to simplify the following discussion:

$T_{CL}$=lower bound chamber temperature $T_{CU}$=upper bound chamber temperature $T_{CR}=[T_{CL},T_{CU}]$=temperatures ranging from $T_{CL}$ to $T_{CU}$, inclusive $T_{SL}$=lower bound platen surface temperature $T_{SU}$=upper bound platen surface temperature $T_{SR}=[T_{SL},T_{SU}]$=temperatures ranging from $T_{SL}$ to $T_{SU}$, inclusive $T_{NL}$=lower bound nozzle temperature $T_{NU}$=upper bound nozzle temperature $T_{NR}=[T_{NL},T_{NU}]$=temperatures ranging from $T_{NL}$ to $T_{NU}$, inclusive As explained below, a process continually monitors the temperatures $T_S$ and $T_N$ during the dressing process, aborting the process if the temperatures fall outside the ranges $T_{SR}$ and $T_{NR}$, respectively. This ensures proper functioning of the system 200.

In the step 301, the system 200 is initialized, such as by initializing processing parameters. In the step 305, the PCB 100 is secured to the platen 220, and in the step 310 the system 200 is activated, such as by pressing the START button 273. Activating the system 200 energizes the chamber 210 and the desoldering tool 280, causing the temperatures $T_C$ and $T_N$ to increase. As described in more detail below, the system 200 is able to dress different pads by automatically determining a solder path (e.g., starting point and contour) of a pad and the pre-determined temperature ranges $T_{CR}$, $T_{SR}$, $T_{NR}$ from information on the PCB 100. Alternatively, this information is all fixed; that is, the system 200 is configured to dress only a particular pad having a particular solder path and a particular type of solder.

In one embodiment, the solder path (e.g., configuration or shape) is stored in the system 200 as a series of relative movements from the initial starting point (e.g., point A in FIG. 3), such as (0.1, 0.1), (−0.1, 0.1), (−0.1, 0.1) . . . (0.1, 0.1), indicating that the nozzle tip 230 is first moved 0.1 mm along the x-axis and 0.1 mm along the y-axis, then −0.1 mm along the x-axis and 0.1 mm along the y-axis, then −0.1 mm along the x-axis and 0.1 mm along the y-axis, etc., and lastly 0.1 mm along the x-axis and 0.1 mm along the y-axis, thereby traversing the entire solder path 110B. As described in more detail below, in one embodiment the system 200 stores multiple solder paths for multiple PCBs, thereby allowing the system 200 to automatically configure itself to dress PCBs having multiple, different solder paths.

Those skilled in the art will recognize other ways to store pad configurations for traversal, such as by using a converter (e.g., file-to-numerical control programming language converters) or mathematical equations, each representing a different solder path. One example of a converter is the Drawing Exchange Format (DXF) to G-code converter. Those skilled in the art will recognize other converters that are able to be used in accordance with the embodiments of the invention.

Those skilled in the art will also recognize that the temperature ranges $T_{CR}$, $T_{SR}$, and $T_{NR}$ vary for different processes. For example, the range $T_{CR}$ (which produces temperatures $T_S$ in the range $T_{SR}$) varies with the thermal properties of the platen 220. Less thermally conductive platens require larger values of $T_{CU}$ to heat it. The range $T_{CR}$ also varies with the type of substrate used for the PCB and the components on the PCB, since some components are more easily damaged by high temperatures. The range $T_{NR}$ varies with the type of solder used, since different solders melt at different temperatures. As some examples, $T_{SR}$=[100° C., 140° C.] and $T_{NR}$=[200° C., 250° C.].

Following the step 310, the temperatures $T_S$ and $T_N$ are determined (e.g., read by the sensors 215B-C and transmitted to the controller 205) and, in the step 320, the process determines whether the temperature $T_S$ is in the range $T_{SR}$ (e.g., is an allowable working temperature). If the temperature $T_S$ is within the range $T_{SR}$, then the process proceeds to the step 330; otherwise, the process proceeds to the step 325, where the temperature $T_C$ is properly increased or decreased, accordingly, until $T_S$ is in the range $T_{SR}$, and then loops back to the step 315.

In the step 330, the process determines whether the temperature $T_N$ is in the range $T_{NR}$. If $T_N$ is within the range $T_{NR}$, then the process proceeds to the step 405, shown in FIG. 13; otherwise, the process continues to the step 335, where the temperature $T_N$ is increased or decreased accordingly until it is within the range $T_{NR}$, and then loops back to the step 315.

Figure 13:
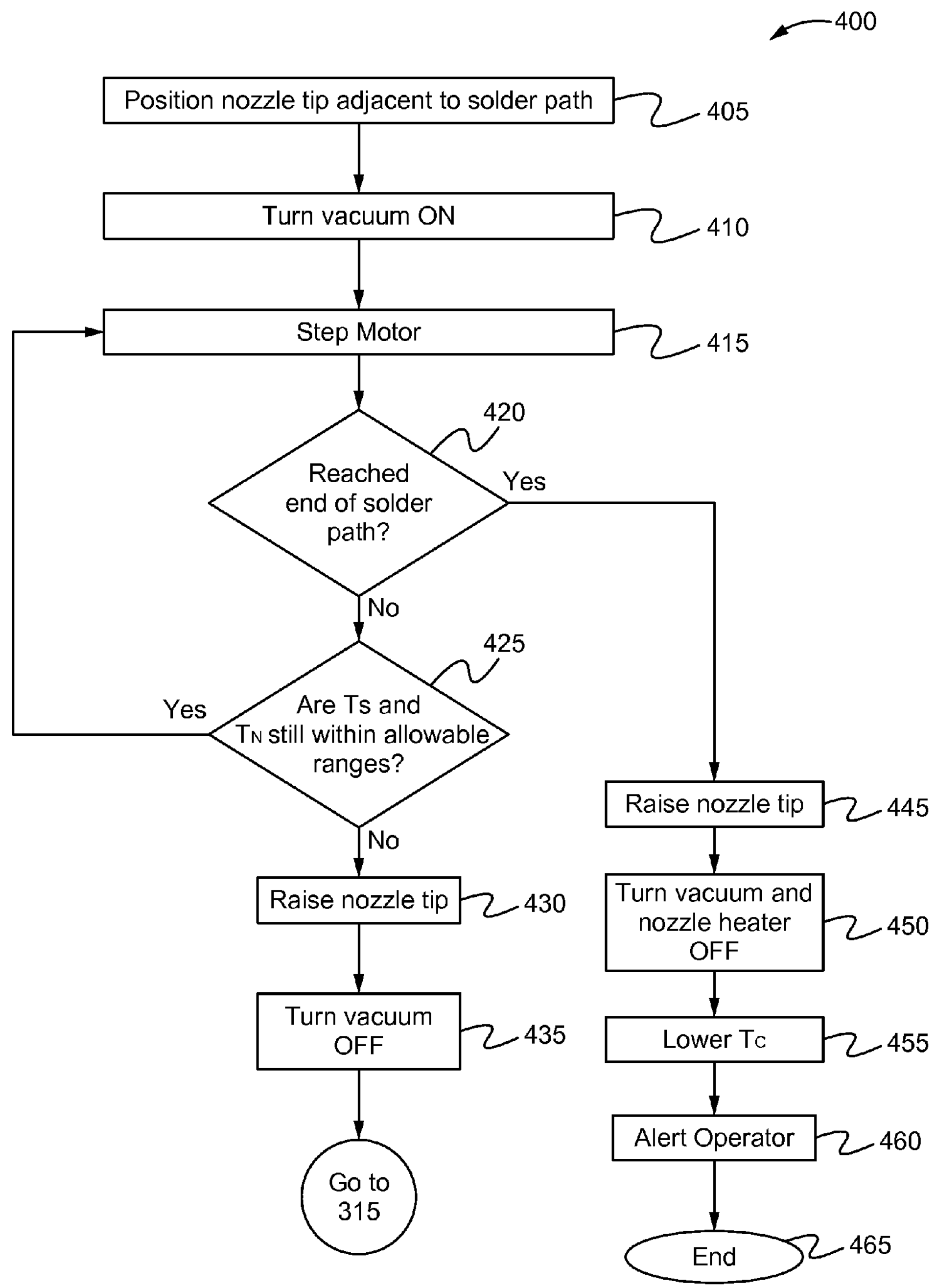
FIG. 13 shows the steps of a process for dressing a contact pad on a PCB, in accordance with one embodiment of the invention.

Referring now to FIG. 13, in the step 405, the motors 245A-B move the tip 230 above the start point A on the solder path 110B, and, using signals from the detector 263, the motor 425C lowers the tip 230 adjacent to the start point A. The solder adjacent to the tip 230 is melted. In the step 410, the vacuum 240 attached to the tip 230 is turned ON, so that the desoldering tool 280 is now vacuuming melted solder at the start point "A". In the step 415, the motors 245A-B step the desoldering tool 280 a first increment (e.g., (1.0 mm, 1.0 mm)) and at the step 420 the process determines whether the entire solder path 110B has been traversed. If the entire solder path 110B has been traversed, the process proceeds to the step 445; otherwise, the process proceeds to the step 425. In the step 425, the process again determines whether the temperatures $T_S$ and $T_N$ are in the ranges $T_{SR}$ and $T_{NR}$, respectively. If the temperatures $T_S$ and $T_N$ are in the ranges $T_{SR}$ and $T_{NR}$, respectively, the process loops back to the step 415; otherwise the process continues to the step 430. In one embodiment, when either one or both of the temperatures $T_S$ and $T_N$ are out of their respective ranges, $T_{SR}$ and $T_{NR}$, the display monitor 201 displays the values of the temperatures $T_S$ and $T_N$, along with a "Temperature out of range" message.

In the step 430, using signals from the detector 263, the motor 245C raises the tip 230 from the surface of the PCB 100. In the step 435, the vacuum 240 on the desoldering tool 280 is turned OFF. From the step 435, the process loops back to the step 315.

In the step 445, the motor 245C raises the tip 230 from the PCB 100 and in the step 450 the vacuum 240 and nozzle heater 246 on the desoldering tool 280 are both turned OFF. In the step 455, the temperature $T_C$ is reduced so that the PCB 100 is sufficiently cooled (e.g. to a predetermined temperature) to allow an operator, or alternatively a robot arm, to remove the PCB 100 from the platen 220. From the step 455, the process continues to the step 460, in which an operator is alerted that the dressing process is complete, such as by the display monitor 201 flashing a "DRESSING COMPLETE" message. From the step 460, the process continues to the step 465, where it ENDs. The PCB 100 can now be removed from the platen 220 for inspection.

While the example describes a single controller 205 performing the steps 300 and 400, it will be appreciated that other controllers (e.g., PLC 262) are able to perform these steps. Alternatively, these steps are divided across multiple controllers (e.g., 205 and PLC 262). For example, the controller 205 can perform some of the steps 300 and 400, while the PLC 262 performs others of the steps 300 and 400. The controllers for performing the steps 300 and 400 are able to be separate from the work table 290, integrated with the work table 290, or a combination of both.

In one embodiment, the controller 205, the PLC 262, or both include a processor and a computer-readable medium that contains computer-executable instructions that when executed by the processor perform the steps 300 and 400 or a subset of the steps 300 and 400.

As explained above, in one embodiment the system 200 is configured to dress different PCBs having different solder paths. In one embodiment, each PCB has a label that identifies a solder path that must be traversed. In one embodiment, the system 200 includes a label reader for reading a label on a PCB, and the controller 205 stores a table that maps each of multiple labels to a corresponding one of multiple solder paths.

Figure 14:
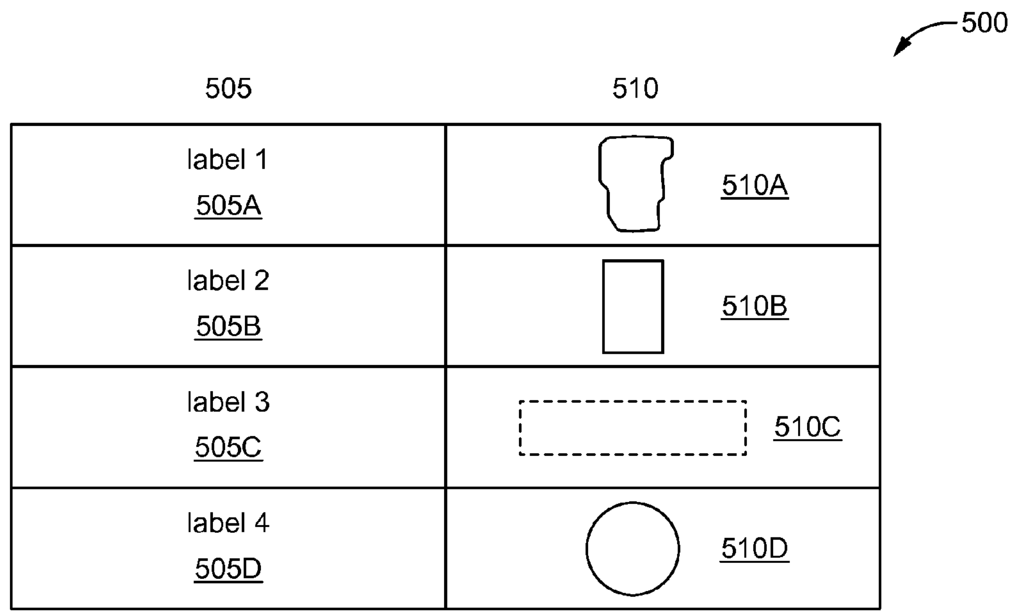
FIG. 14 shows a table mapping labels to solder paths, in accordance with one embodiment of the invention.

FIG. 14 shows a table 500 in accordance with one embodiment of the invention. The table 500 includes a first row that maps a label 505A to a solder path 510A, a second row that maps a label 505B to a solder path 510B, a third row that maps a label 505C to a (discontinuous) solder path 510C, and a fourth row that maps a label 505D to a solder path 510D. As some examples, the labels are attached to, stamped on, or embedded within a surface of a PCB and include striped bar codes, matrix bar codes (such as a Quick Response Code), alphanumeric strings, or any other machine-readable label. The corresponding label readers include striped bar code readers, matrix bar code readers, alphanumeric string readers, and optical bar code readers.

The table 500 is shown storing actual shapes 510A-D of solder paths merely to simplify the table 500. In practice, the table 500 generally stores other representations of the solder paths, such as an array of incremental offsets that define the solder path (e.g., an array of elements such as (−1 mm, 1 mm)), a pointer to an array of incremental offsets, DXF to G-code converters, or functionally equivalent elements.

Figure 15:
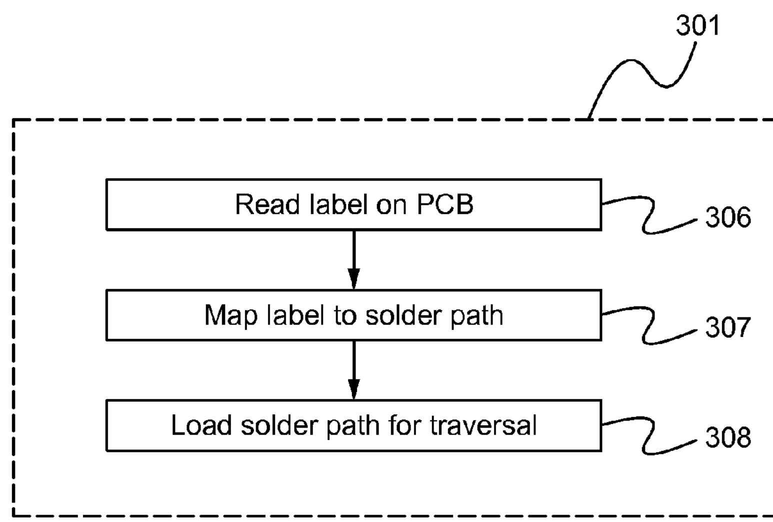
FIG. 15 shows the steps of a process for initializing the system of FIG. 4, in accordance with one embodiment of the invention.

FIG. 15 shows the component steps (sub-steps) included in the element 301 of FIG. 12, when a PCB is labeled with a solder-path-identifying code, such as the elements 505A-D in FIG. 10. In the step 306, the solder-path-identifying code is read from a PCB using a label reader. Next, in the step 307, the code is mapped to a solder path, such as by using the mapping table 500. Next, in the step 308, the solder path is traversed during the dressing stage.

It will be appreciated that in one embodiment, the steps 301 are only a subset of the steps used to initialize the system 200. In other embodiments, other elements of the system 200 are also initialized.

In yet another embodiment, the automated system 200 is further configured to dispense paste for reflow soldering. In one embodiment, the desoldering tool 280 is also configured to automatically dispense solder paste. After the pad 110A has been dressed and the PCB 100 reworked, such as by replacing the RF-sensitive components 111 under the RF shield 105, the PCB 100 is again mounted and secured to the platen 220 as in the step 305 of FIG. 12. The steps 300 and 400 are performed, with the step "turn solder dispenser ON" replacing the step 410 "turn vacuum ON". In other words, the desoldering tool 280 traverses the pad 110A to lay down a strip of solder paste along a length of the pad 110A. It will be appreciated that the temperatures $T_C$ and $T_S$ are adjusted for dispensing solder rather than dressing a pad. Once the solder paste has been disposed along a length of the pad 110A, the RF-shield 105 is replaced, manually or by robot, and the entire PCB 100 put in a reflow oven.

In yet another embodiment, the system 200 is also configured to screw components onto the PCB 100, such as by using a robot arm.

It will be appreciated that the steps 300 and 400 are merely illustrative of some embodiments of the invention. In other embodiments, at least some of the steps 300 and 400 are performed in different orders, some steps are deleted, other steps are added, or some combination of these variations are combined.

In operation, a PCB is dressed for rework, by removing an RF shield that is soldered to the PCB along a solder path. The PCB bears a label, such as a matrix code, which also uniquely identifies a solder path along which solder must be removed and, optionally, replaced. After the RF shield has been removed from the PCB in a previous step, leaving residue solder on the pad, the PCB is secured to a table of an automated tool. Preferably, the PCB is secured in a way that properly orients the PCB on the table, such that the start point of the solder path is at a known location on the table. The label is used to determine the solder path, such as by using a lookup table. The PCB is then pre-heated to heat the residue solder and to prevent thermal stress during the dressing process. A heated tip of a desoldering tool is placed adjacent to the start point of the solder path to melt solder on the solder path and its vacuum is turned ON. The tip is then moved along the solder path, tracing a contour of the solder path, to remove all or a threshold amount of the melted solder. After the PCB cools to a predetermined temperature, it is removed and inspected, and one or more components on the PCB are reworked, such as by replacement. Next, solder is automatically disposed along the solder path, the RF shield is replaced on the pad, and the PCB is subjected to a solder reflow process. The PCB is then replaced in the reworked electronic device.

While the examples above describe replacing RF shields, it will be appreciated that pads for any type of electronic component on a PCB are able to be dressed in accordance with the principles of the invention.

Further, while the examples describe using a vacuum to remove melted solder, it will be appreciated that melted solder is able to be removed in other ways, such as by wicking or by attracting the melted solder using electric fields, to name only a few examples. Furthermore, while the examples show dressing pads for surface mounted devices, it will be appreciated that the principles of the invention are also able to be used for dressing pads on through-hole mounted and other devices.

It will be readily apparent to one skilled in the art that other various modifications may be made to the embodiments without departing from the spirit and scope of the invention as defined by the appended claims.

We claim:

1. A method of dressing a printed circuit board (PCB) pad, wherein the PCB pad has solder disposed along its length, thereby defining a solder path, the method comprising:

pre-heating a surface of the PCB to a surface temperature sufficient to prevent thermal stress of the PCB during dressing of the PCB;

melting the solder along the solder path;

automatically traversing the solder path while removing melted solder therefrom; and automatically maintaining the surface temperature within a predetermined range $[T_{SL}, T_{SU}]$ while traversing the solder path; and continually monitors the surface temperature and aborting the dressing when the surface temperature falls outside the predetermined range.

2. The method of claim 1, wherein the removing melted solder comprises vacuuming the melted solder, wicking the melted solder, or electromagnetically attracting the melted solder.

3. The method of claim 1, wherein the temperature $T_{SL}$ is sufficient to prevent thermal stress of the PCB during dressing of the PCB and the temperature $T_{SU}$ is insufficient to damage electronic components on the PCB during the dressing of the PCB.

4. The method of claim 3, wherein the predetermined range $[T_{SL}, T_{SU}]$ is approximately 120° C. to 140° C.

5. The method of claim 4, wherein automatically melting the solder along the solder path comprises placing a nozzle at a temperature $T_N$ within a predetermined range $[T_{NL}, T_{NU}]$ on or adjacent to the solder along the solder path.

6. The method of claim 5, wherein the predetermined range $[T_{NL}, T_{NU}]$ is approximately 200° C. to 250° C.

7. The method of claim 6, wherein the pad is a radio frequency (RF) shield pad for mounting an RF shield.

8. The method of claim 7 wherein pre-heating the surface of the PCB comprises heating a chamber in thermal contact with the PCB.

9. The method of claim 1, further comprising automatically applying a solder paste to the PCB pad after removing the melted solder.

* * * * *